(12) United States Patent
Fantini et al.

(10) Patent No.: US 12,408,332 B2
(45) Date of Patent: Sep. 2, 2025

(54) MEMORY DEVICES HAVING ONE-TIME-PROGRAMMABLE FUSES AND/OR ANTIFUSES FORMED FROM THIN-FILM TRANSISTORS

(71) Applicant: Micron Technology, Inc., Boise, ID (US)

(72) Inventors: Paolo Fantini, Vimercate (IT); Lorenzo Fratin, Milan (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 492 days.

(21) Appl. No.: 17/898,232

(22) Filed: Aug. 29, 2022

(65) Prior Publication Data
US 2024/0074168 A1 Feb. 29, 2024

(51) Int. Cl.
*H10B 20/25* (2023.01)

(52) U.S. Cl.
CPC .................... *H10B 20/25* (2023.02)

(58) Field of Classification Search
CPC ........ H10B 20/25; H10B 63/10; H10B 63/34; H10B 63/845; H10B 20/20; H10N 70/20; H10N 70/231; H10N 70/823; H10N 70/8825
See application file for complete search history.

(56) References Cited

U.S. PATENT DOCUMENTS 9,653,562 B2 * 5/2017 Kim .................. H10B 41/41
2022/0190131 A1 * 6/2022 Ko .................. H01L 23/5283

\* cited by examiner

*Primary Examiner* — Allison Bernstein
(74) *Attorney, Agent, or Firm* — Dorsey & Whitney LLP

(57) ABSTRACT

Memory devices, and associated systems and methods, are disclosed herein. A representative memory device comprises a substrate, an insulative layer over the substrate, and a memory array over the insulative layer. The memory device further comprises a fuse array positioned in the insulative layer and configured as a non-volatile memory that can store trimming and/or other factors. The fuse array can comprise a plurality of transistors configured as fuses and each including a source, a drain, and a gate. The transistors in a first subset of the transistors have a first resistance across one of the source, the drain, and the gate that represents a first logic state, and the transistors in a second subset of the transistors can have a second resistance across the one of the source, the drain, and the gate that is greater than the first resistance and that represents a second logic state.

25 Claims, 10 Drawing Sheets

MEMORY DEVICES HAVING ONE-TIME-PROGRAMMABLE FUSES AND/OR ANTIFUSES FORMED FROM THIN-FILM TRANSISTORS

TECHNICAL FIELD

The present disclosure generally relates to semiconductor devices, such as three-dimensional (3D) memory devices, including a fuse and/or antifuse array formed from thin-film transistors (TFTs).

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
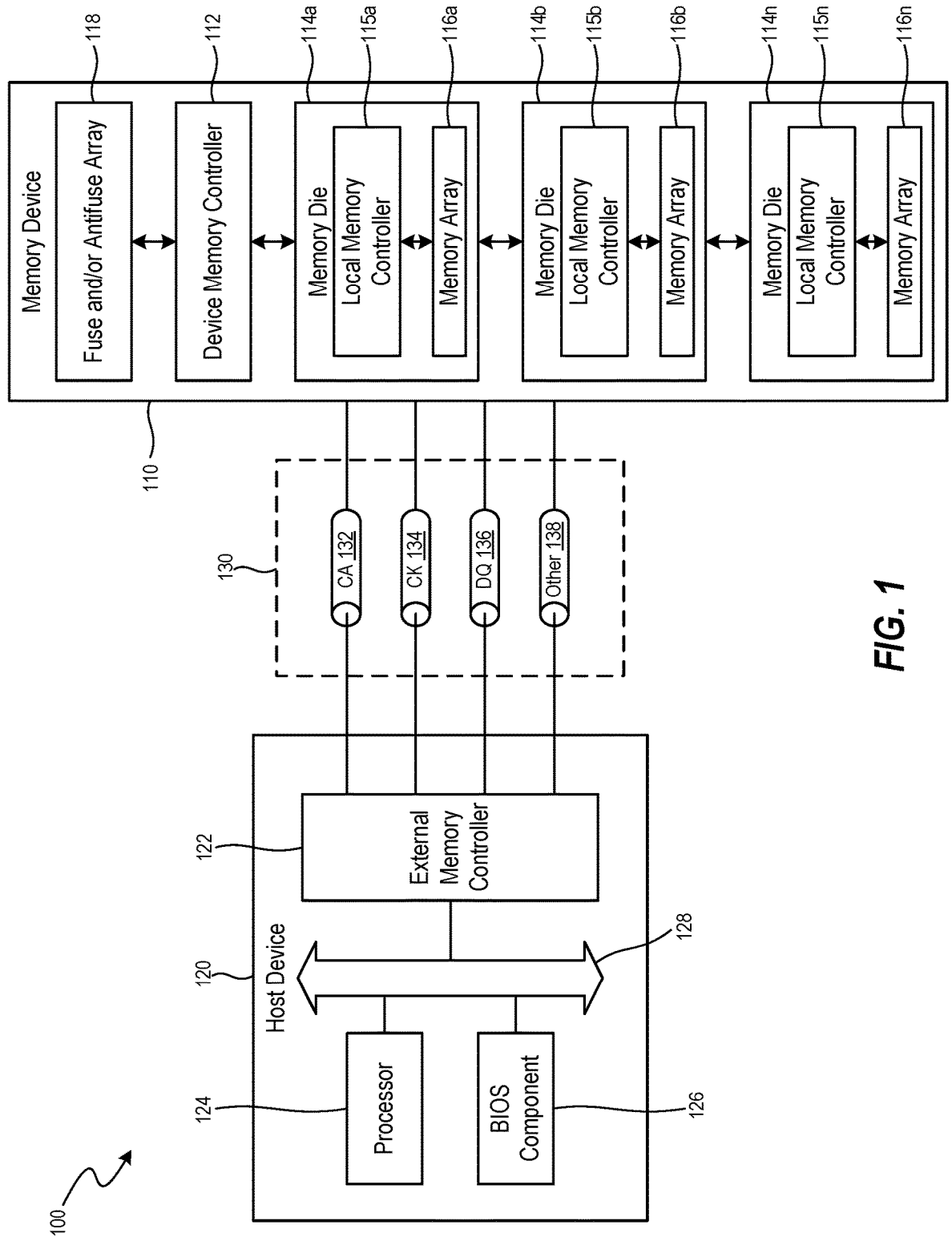
FIG. 1 is a schematic view of a system incorporating a memory device in accordance with embodiments of the present technology.

Embodiments of the present technology are directed to semiconductor devices, such as memory devices, and associated systems and methods. In several of the embodiments described below, a representative memory device comprises a substrate, an insulative layer over the substrate, and a memory array over the insulative layer. The memory array can be a three-dimensional (3D) memory array including a plurality of memory cells arranged in stacks and a plurality of conductive pillars electrically coupled to corresponding ones of the stacks of memory cells. The memory device can further comprise a plurality of transistors, such as thin-film transistors (TFTs), formed in the insulative layer and each having a source, a drain, and a gate.

First ones of the transistors can be electrically coupled to corresponding ones of the conductive pillars and can be used to select a conductive pillar during an access operation to one of the memory cells. The first transistors can be located under the memory array. Second ones of the transistors can be configured as fuses (or antifuses) and can form a fuse (or antifuse) array that can be programmed as a non-volatile memory (NVM) to store trim and/or other factors. The second transistors in the fuse array can each have either (i) a first resistance across one of the source, the drain, and the gate that represents a first logic state or (ii) a second resistance across the one of the source, the drain, and the gate that is greater than the first resistance. In some embodiments, the second transistors are programmed by selectively applying a programming current across the source, the drain, and/or the gate to break down (e.g., blow) a material thereof to increase the resistance of the transistor from the first resistance to the second resistance.

In some aspects of the present technology, the second transistors configured as fuses can be formed in the insulative material along open regions of the substrate that do not contain other functional elements. For example, the second transistors can be formed in a region of the insulative material that is not below the memory array, such as at a periphery of the substrate. Additionally, the second transistors can be formed using the same process and manufacturing steps as the first transistors. Accordingly, some aspects of the present technology provide for the efficient formation of a fuse array without increasing the size of the memory device and without adding additional process and manufacturing steps.

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1-7. In other instances, well-known structures or operations often associated with semiconductor devices, memory devices, etc., are not shown, or are not described in detail, to avoid obscuring other aspects of the technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 is a schematic view of a system 100 incorporating a memory device 110 in accordance with embodiments of the present technology. In the illustrated embodiment, the system 100 further includes a host device 120 and a plurality of channels 130 coupling the host device 120 with the memory device 110. The system 100 can include one or more memory devices, but aspects of the one or more memory devices can be described in the context of a single memory device (e.g., the memory device 110).

In some embodiments, the system 100 comprises one or more portions of an electronic device, such as a computing device, a mobile computing device, a wireless device, a graphics processing device, a vehicle, and/or other system. For example, the system 100 can illustrate aspects of a computer, a laptop computer, a tablet computer, a smartphone, a cellular phone, a wearable device, an Internet-connected device, a vehicle controller, and/or the like. The memory device 110 can be a component of the system 100 configured to store data for one or more other components of the system 100.

The host device 120 can include/comprise a processor and/or other circuitry that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), and/or another stationary or portable electronic device. In the illustrated embodiment, the host device 120 includes an external memory controller 122, a processor 124, and a basic input/output system (BIOS) component 126. The host device 120 can include more or fewer components, such as one or more peripheral components or one or more input/output controllers. The components of the host device 120 can be coupled with one another using a bus 128. In some embodiments, the host device 120 can comprise hardware, firmware, and/or software that implements the functions of the external memory controller 122.

The processor 124 can be configured to provide control or other functionality for at least portions of the system 100 or at least portions of the host device 120. The processor 124 can be a general-purpose processor, a digital signal processor (DSP), an application-specific integrated circuit (ASIC), a field-programmable gate array (FPGA) or other programmable logic device, discrete gate or transistor logic, and/or discrete hardware components. In some embodiments, the processor 124 is a central processing unit (CPU), a graphics processing unit (GPU), a general-purpose GPU (GPGPU), and/or a system on chip (SoC). In some embodiments, the external memory controller 122 can be implemented by or be a part of the processor 124.

The BIOS component 126 can be a software component that includes a BIOS operated as firmware, which can initialize and run various hardware components of the system 100 or the host device 120. The BIOS component 126 can also manage data flow between the processor 124 and the various components of the system 100 or the host device 120. The BIOS component 126 can include a program or software stored in one or more of read-only memory (ROM), flash memory, and/or other non-volatile memory.

The memory device 110 can be an independent device or a component that is configured to provide physical memory addresses/space that can be used or referenced by the system 100. In some embodiments, the memory device 110 is configurable to work with one or more different types of host devices 120. Signaling between the host device 120 and the memory device 110 can be operable to support modulation schemes to modulate the signals, various pin configurations for communicating the signals, various form factors for physical packaging of the host device 120 and the memory device 110, clock signaling and synchronization between the host device 120 and the memory device 110, timing conventions, and/or other factors.

The memory device 110 can be configured to store data for the components of the host device 120. In some embodiments, the memory device 110 acts as a secondary-type or dependent-type device to the host device 120 (e.g., responding to and executing commands provided by the host device 120 through the external memory controller 122). Such commands can include a write command for a write operation, a read command for a read operation, a refresh command for a refresh operation, and/or other commands.

In the illustrated embodiment, the memory device 110 includes a device memory controller 112 and one or more memory dies 114 (e.g., memory chips; individually identified as memory dies 114a-114n) to support a desired capacity or a specified capacity for data storage. Each memory die 114 can include a local memory controller 115 (individually identified as local memory controllers 115a-115n) and a memory array 116 (individually identified as memory arrays 116a-116n). The memory arrays 116 can be a collection (e.g., one or more grids, one or more banks, one or more tiles, one or more sections) of memory cells, with each memory cell being operable to store at least one bit of data. When the memory device 110 includes two or more of the memory dies 114, the memory device 110 can be referred to as a multi-die memory, a multi-die package, a multi-chip memory, and/or a multi-chip package.

The memory dies 114 can be two-dimensional (2D) arrays of memory cells or can be three-dimensional (3D) arrays of memory cells. A 2D memory die 114 can include a single memory array 116. A 3D memory die 114 can include two or more memory arrays 116, which can be stacked on top of one another or positioned next to one another (e.g., relative to a substrate). In some embodiments, the memory arrays 116 in a 3D memory die 114 can be referred to as decks, levels, layers, or dies. A 3D memory die 114 can include any quantity of the stacked memory arrays 116 (e.g., two high, three high, four high, five high, six high, seven high, eight high, or higher). In some 3D memory dies 114, different decks can share at least one common access line such that some decks can share a row line and/or column line. For example, as described herein, different decks can share a same pillar for accessing corresponding memory cells.

The device memory controller 112 can include circuits, logic, and/or other components operable to control operation of the memory device 110. The device memory controller 112 can include hardware, firmware, and/or instructions that enable the memory device 110 to perform various operations and can be operable to receive, transmit, or execute commands, data, and/or control information related to the components of the memory device 110. The device memory controller 112 can be configured to communicate with the external memory controller 122, the memory dies 114, and/or the processor 124. In some embodiments, the device memory controller 112 controls operation of the memory device 110 described herein in conjunction with the local memory controllers 115 of the memory dies 114.

In the illustrated embodiment, the memory device 110 further includes a fuse and/or antifuse array 118 ("fuse array 118"). The fuse array 118 can comprise a plurality of fuses and/or antifuses that are one-time-programmable to store information related to operating parameters of the memory device 110 and/or the memory dies 114. For example, the fuse array 118 can be programmed as a non-volatile memory (NVM) array to store trim factors (e.g., trim codes) for the memory dies 114. The trim factors can be used for dynamic trim selection based on operating voltage levels of the memory device 110. For example, when the memory device 110 is probed (e.g., during test procedures or probe tests), the memory device 110 can be characterized across multiple ranges of voltage levels, under which the memory device 110 could operate (e.g., the total window of voltage levels of VDD, multiple customer preferred voltage levels). In some embodiments, such multiple ranges of voltage levels may account for the entire range (e.g., window) of voltage levels of the operating voltage (e.g., across entire VDD levels). That is, multiple sets of trimming conditions can be determined based on multiple ranges (e.g., sub-ranges) of the voltage levels that correspond to the entire range in aggregate. In some embodiments, the multiple ranges of voltage levels do not overlap each other. Each trim condition can be represented as a trim code having a certain quantity of bits (e.g., 2 bits, 3 bits, 4 bits, 5 bits). As such, a plurality of trim codes can be generated during the probe tests, where each trim code of the plurality corresponds to one of multiple ranges of voltage levels of the operating voltage.

During operations of the memory device 110 (e.g., initialization procedures, power-up sequences), the memory device 110 can retrieve (e.g., read) the trim codes from the fuse array 118 and store them in one or more internal latches (e.g., registers, special purpose memory arrays) and/or other components. Further, the memory device 110 can determine that the VDD level supplied to the memory device 110 is within one of the multiple ranges of voltage levels. To that end, in some embodiments, the memory device 110 includes a voltage detection circuit configured to detect the voltage level of the operating voltage (the VDD level). In other embodiments, the memory device 110 includes a mode register configured to store an indication of the voltage level of the operating voltage. Based on determining the voltage level supplied to the memory device 110 as its operating voltage, the memory device 110 can select one of the trim codes stored in the internal latches. Subsequently, the memory device 110 can transmit the selected trim code to a trim adjustment circuit of the memory device 110 configured to adjust a set of timing and/or voltage conditions for one or more trimmable circuits of the memory device 110 (e.g., performance critical, VDD-sensitive circuits) according to the selected trim code.

In this manner, various trimmable circuits of the memory device 110 can operate with the appropriate set of timing and/or voltage conditions that have been preconfigured (predetermined, preidentified) during the probe tests based on the VDD levels supplied to the memory device 110. Further, managing the inventory of the memory device 110 can be simplified in view of the trim codes stored in the fuse array 118 of the memory device 110, which can be retrieved and selected based on the actual voltage levels of the operating voltage supplied to the memory device 110.

In some embodiments, the memory device 110 receives data and/or commands from the host device 120. For example, the memory device 110 can receive a write command indicating that the memory device 110 is to store data for the host device 120 or a read command indicating that the memory device 110 is to provide data stored in a memory die 114 to the host device 120. In response to a respective command, the memory device 110 can write data to one or more memory cells (e.g., in response to a write command) or can read data from one or more memory cells (e.g., in response to a read command).

The local memory controllers 115 can include circuits, logic, and/or other components configured to control operation of the memory dies 114. In some embodiments, the local memory controllers 115 are configured to communicate (e.g., receive and/or transmit data and/or commands) with the device memory controller 112. In some embodiments, the memory device 110 does not include the device memory controller 112, and one or more of the local memory controllers 115 and/or the external memory controller 122 can perform various functions described herein. As such, the local memory controllers 115 can be configured to communicate with the device memory controller 112, with other ones of the local memory controllers 115, and/or directly with the external memory controller 122 and/or the processor 124. Examples of components that can be included in the device memory controller 112 and/or the local memory controllers 115 can include receivers for receiving signals (e.g., from the external memory controller 122), transmitters for transmitting signals (e.g., to the external memory controller 122), decoders for decoding or demodulating received signals, encoders for encoding or modulating signals to be transmitted, and/or various other circuits or controllers operable for supporting described operations of the device memory controller 112 and/or the local memory controllers 115.

The external memory controller 122 can be configured to enable communication of one or more of information, data, or commands between components of the system 100 or the host device 120 (e.g., the processor 124) and the memory device 110. The external memory controller 122 can convert or translate communications exchanged between the components of the host device 120 and the memory device 110. In some embodiments, the external memory controller 122 and/or other components of the system 100, or its functions described herein, can be implemented by the processor 124. For example, the external memory controller 122 can comprise hardware, firmware, and/or software implemented by the processor 124 and/or another component of the system 100. Although the external memory controller 122 is depicted as being external to the memory device 110, in some embodiments, the external memory controller 122, or its functions described herein, can be implemented by one or more components of a memory device 110 (e.g., the device memory controllers 112, the local memory controllers 115) or vice versa.

The components of the host device 120 can exchange information with the memory device 110 using one or more of the channels 130. The channels 130 can be configured to support communications between the external memory controller 122 and the memory device 110. The channels 130 can be transmission mediums that carry information between the host device 120 and the memory device 110, and can include one or more signal paths or transmission mediums (e.g., conductors, conductive paths operable to carry signals) between terminals associated with the components of the system 100. For example, the channels 130 can each include a first terminal including one or more pins or pads (e.g., conductive input and/or output points) at the host device 120 and one or more pins or pads at the memory device 110.

In some embodiments, the channels 130 (and associated signal paths and terminals) are dedicated to communicating one or more types of information. For example, in the illustrated embodiment the channels 130 include (i) one or more command and address (CA) channels 132, (ii) one or more clock signal (CK) channels 134, (iii) one or more data (DQ) channels 136, and (iv) one or more other channels 138.

In some embodiments, signaling can be communicated over the channels 130 using single data rate (SDR) signaling or double data rate (DDR) signaling. In SDR signaling, one modulation symbol (e.g., signal level) of a signal can be registered for each clock cycle (e.g., on a rising or falling edge of a clock signal). In DDR signaling, two modulation symbols (e.g., signal levels) of a signal can be registered for each clock cycle (e.g., on both a rising edge and a falling edge of a clock signal).

In some embodiments, the CA channels 132 are configured to communicate commands between the host device 120 and the memory device 110 including control information associated with the commands (e.g., address information). For example, the CA channels 132 can include a read command with an address of the desired data. The CA channels 132 can include any quantity of signal paths to decode one or more of address or command data (e.g., eight or nine signal paths). In some embodiments, the DQ channels 136 are configured to communicate one or more of data or control information between the host device 120 and the memory device 110. For example, the DQ channels 136 can communicate information (e.g., bi-directional) to be written to the memory device 110 or information to read from the memory device 110.

Figure 2:
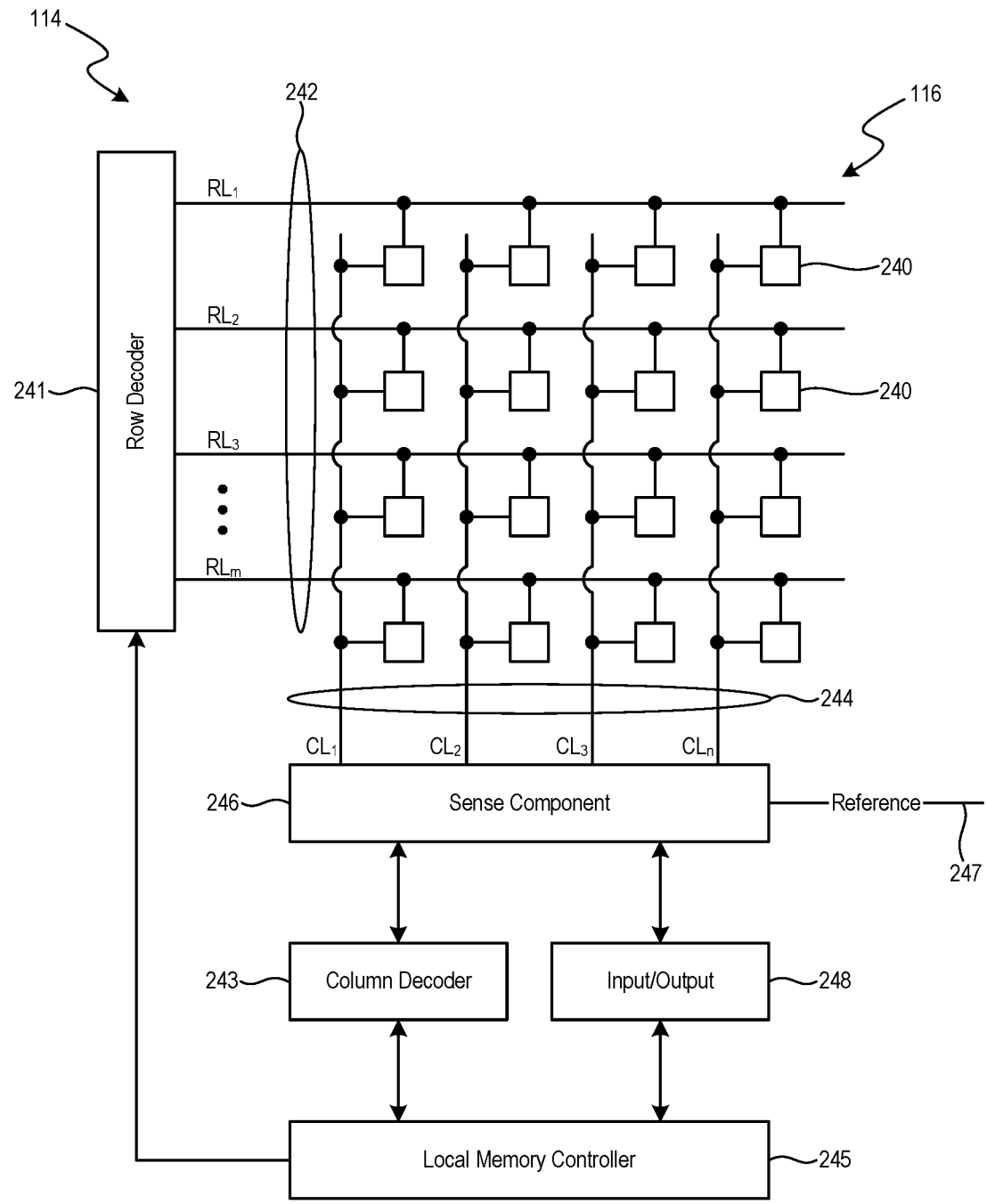
FIG. 2 is a schematic view illustrating the electrical operation of a memory die in accordance with embodiments of the present technology.

FIG. 2 is a schematic view illustrating the electrical operation of a memory die, such as one of the memory dies 114 of FIG. 1, in accordance with embodiments of the present technology. In the illustrated embodiment, the memory die 114 includes the memory array 116 formed of a plurality of memory cells 240 each positioned at an intersection of respective access lines, such as row lines 242 (identified individually as row lines $RL_1$-$RL_m$) and column lines 244 (identified individually as column lines $CL_1$-$CL_n$). In some embodiments, the access lines (e.g., the row lines 242 and the column lines 244) are conductive lines coupled with corresponding ones of the memory cells 240 and can be used to perform access operations on the memory cells 240. In some embodiments, the access lines are arranged in a pattern, such as a grid-like pattern. The access lines can be formed of one or more electrically conductive materials. In some embodiments, the row lines 242 can be referred to as word lines, and the column lines 244 can be referred to as digit lines or bit lines. References to access lines, row lines, column lines, word lines, digit lines, or bit lines, or the like, are interchangeable without loss of understanding or operation.

Each of the memory cells 240 can store a logic state using a configurable material, which can be referred to as a memory element, a memory storage element, a material element, a material memory element, a material portion, a polarity-written material portion, and/or the like. A configurable material of the memory cells 240 can refer to a chalcogenide-based storage component, as described in more detail with reference to FIG. 3. For example, a chalcogenide storage element can be used in a phase change memory (PCM) cell, a thresholding memory cell, and/or a self-selecting memory cell.

In some embodiments, as described in greater detail below with reference to FIG. 3, one or more (e.g., all) of the column lines 244 extends generally perpendicularly relative to a substrate (not shown) carrying the memory array 116 and one or more (e.g., all) of the row lines 242 extend generally parallel to the substrate and generally perpendicularly to the column lines 244. Further, in some embodiments one or more of the row lines 242 extends on a different deck or tier of the memory array 116 such that the row lines 242 are stacked above/below one another. The memory array 116 can have many other ones of the memory cells 240 positioned at the intersection of additional ones of the row lines 242 and the column lines 244.

Operations such as reading and writing can be performed on the memory cells 240 by activating or selecting one or more of the row lines 242 and/or the column lines 244. By biasing an individual one of the row lines 242 and an individual one of the column lines 244 (e.g., by applying a voltage to the row line and/or the column line), a single one of the memory cells 240 can be accessed at their intersection. The intersection of an individual one of the row lines 242 and an individual one of the column lines 244 in either a two-dimensional or three-dimensional configuration can be referred to as an address of a corresponding one of the memory cells 240.

In the illustrated embodiment, the memory die 114 further includes a row decoder 241, a column decoder 243, and a local memory controller 245. The row decoder 241 and/or the column decoder 243 can be controlled to access the memory cells. For example, the row decoder 241 can receive a row address from the local memory controller 245 and can activate one of the row lines 242 (e.g., a word line) based on the received row address. Similarly, the column decoder 243 can receive a column address from the local memory controller 245 and can activate one of the column lines 244 (e.g., a pillar) based on the received column address.

In the illustrated embodiment, the memory die 114 further includes a sense component 246 configured to detect a state (e.g., a material state, a resistance, a threshold state) of the memory cells 240 and to determine a logic state of the memory cells 240 based on the stored state. The sense component 246 can include one or more sense amplifiers to amplify or otherwise convert a signal resulting from accessing one of the memory cells 240. The sense component 246 can compare a signal detected from the one of the memory cells 240 to a reference 247 (e.g., a reference voltage or current). The detected logic state of the one of the memory cells 240 can be provided as an output of the sense component 246 to, for example, an input/output 248, and/or can indicate the detected logic state to another component of a memory device (e.g., the memory device 110 of FIG. 1) that includes the memory die 114.

The local memory controller 245 can control the accessing of the memory cells 240 through the various components (e.g., the row decoder 241, the column decoder 243, the sense component 246). Examples of access operations can include a write operation, a read operation, a refresh operation, a precharge operation, and/or an activate operation. In some embodiments, the local memory controller 245 can perform or otherwise coordinate access operations in response to various access commands (e.g., from the host device 120 of FIG. 1). The local memory controller 245 can be configured to perform other access operations not listed here or other operations related to the operating of the memory die 114 that are not directly related to accessing the memory cells 240. The local memory controller 245 can be an example of the local memory controller 115 described with reference to FIG. 1. In some embodiments, the row decoder 241, the column decoder 243, and/or the sense component 246 can be co-located with the local memory controller 245. The local memory controller 245 can be configured to (i) receive commands and/or data from one or more different memory controllers (e.g., the external memory controller 122 associated with a host device 120 of FIG. 1, another controller associated with the memory die 114), (ii) translate the commands or the data (or both) into information that can be used by the memory die 114, (iii)

perform one or more operations on the memory die 114, and/or (iv) communicate data from the memory die 114 to a host device (e.g., the host device 120 of FIG. 1) based on performing the one or more operations. The local memory controller 245 can generate row signals and column address signals to activate a target one of the row lines 242 and a target one of the column lines 244. The local memory controller 245 can also generate and control various voltages or currents used during the operation of the memory die 114. In general, the amplitude, the shape, or the duration of an applied voltage or current discussed herein can be varied and can be different for the various operations discussed in operating the memory die 114.

More specifically, the local memory controller 245 can be configured to perform a write operation (e.g., a programming operation) on one or more of the memory cells 240 of the memory die 114. During a write operation, one or more of the memory cells 240 can be programmed to store a desired logic state. The local memory controller 245 can identify a target one of the memory cells 240 on which to perform the write operation. For example, the local memory controller 245 can identify a target one of the row lines 242 and a target one of the column lines 244 coupled with the target memory cell 240 (e.g., the address of the target memory cell 240), and can activate the target row line 242 and the target column line 244 (e.g., by applying a voltage to the target row line 242 and/or the target column line 244) to access the target memory cell 240. In some embodiments, the local memory controller 245 applies a specific signal (e.g., write pulse) to the target column line 244 during the write operation to store a specific state in the storage element of the memory cell 240. The pulse used as part of the write operation can include one or more voltage levels over a duration.

Similarly, the local memory controller 245 can be configured to perform a read operation (e.g., a sense operation) on one or more memory cells 240 of the memory die 200. During a read operation, the logic state stored in one or more of the memory cells 240 of the memory die 114 can be determined. The local memory controller 245 can identify a target one of the memory cells 240 on which to perform the read operation. For example, the local memory controller 245 can identify a target one of the row lines 242 and a target one of the column lines 244 coupled with the target memory cell 240 (e.g., the address of the target memory cell 240), and can activate the target row line 242 and the target column line 244 (e.g., by applying a voltage to the target row line 242 and/or the target column line 244) to access the target memory cell 240. The sense component 246 can detect a signal received from the target memory cell 240 that is based on the pulse applied to the target row line 242, the pulse applied to the target column line 244, and/or a resistance or threshold characteristic of the target memory cell 240. In some embodiments, the sense component 246 amplifies the detected signal. The local memory controller 245 can activate the sense component 246 (e.g., latch the sense component 246) and thereby compare the signal received from the target memory cell 240 to the reference 247. Based on the comparison, the sense component 246 can determine a logic state that is stored on the target memory cell 240. The pulse used as part of the read operation can include one or more voltage levels over a duration.

Figure 3A:
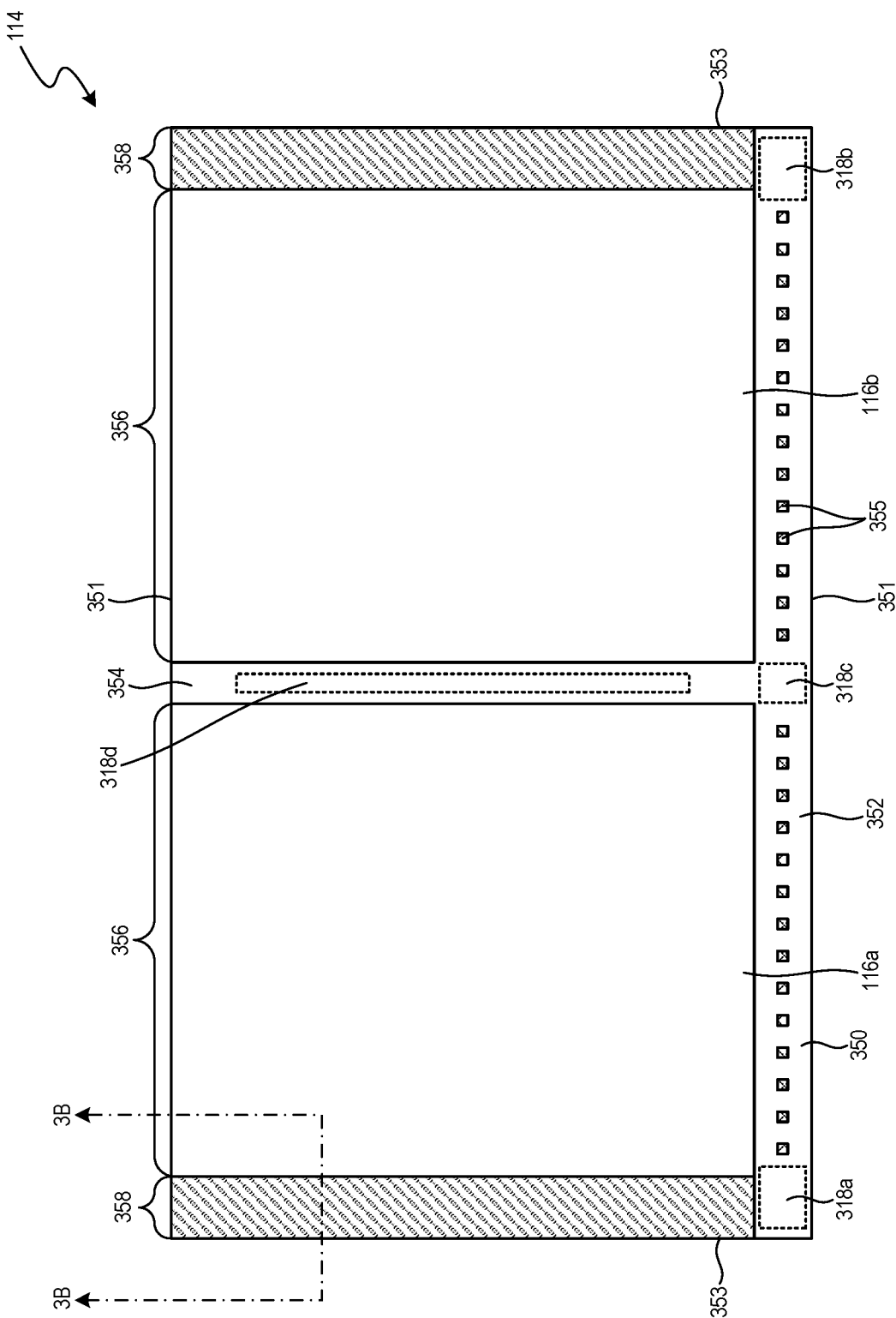
FIG. 3A is a top view of a memory die in accordance with embodiments of present technology.
Figure 3B:
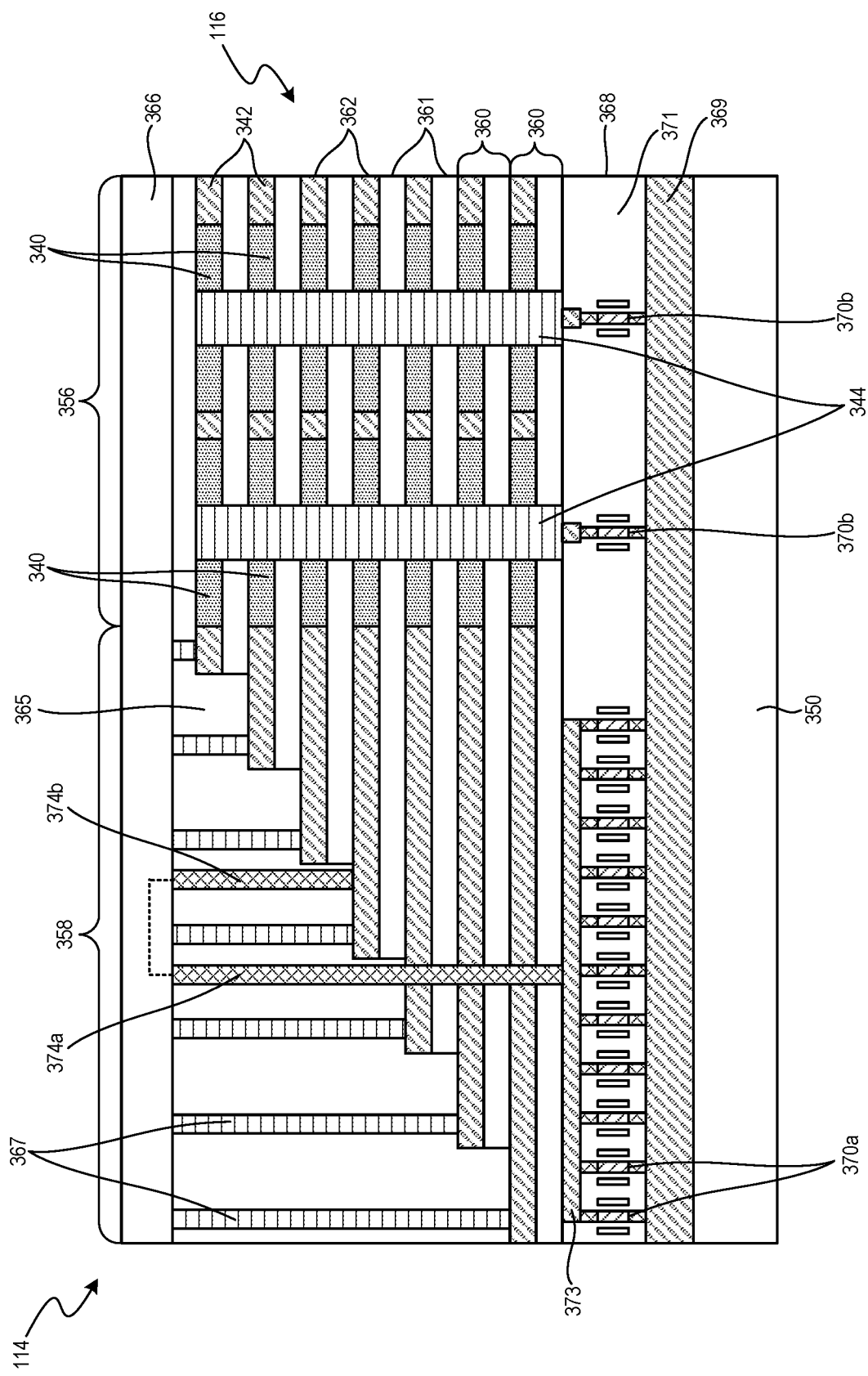
FIG. 3B is a side cross-sectional view of a portion of the memory die of FIG. 3A taken along the line 3B-3B shown in FIG. 3A in accordance with embodiments of the present technology.

FIG. 3A is a top view of a memory die, such as one of the memory dies 114 of FIG. 1, in accordance with embodiments of present technology. FIG. 3B is a side cross-sectional view of a portion of the memory die 114 taken along the line 3B-3B shown in FIG. 3A in accordance with embodiments of the present technology. Referring first to FIG. 3A, the memory die 114 includes a substrate 350 carrying a plurality of the memory arrays 116 (identified individually as a first memory array 116a and a second memory array 116b). The memory arrays 116 are three-dimensional (3D) memory arrays, such as 3D-NAND memory arrays. The substrate 350 can include a redistribution layer, an interposer, a printed circuit board, a dielectric spacer, a semiconductor die, or another suitable substrate.

In the illustrated embodiment, the substrate 350 includes a first open region 352 (e.g., a peripheral open region) and a second open region 354 (e.g., an intermediate open region) at which the substrate 350 (and/or one or more layers thereon) is exposed from the memory arrays 116. More specially, the substrate 350 can include opposing first sides 351 and opposing second sides 353, and the first open region 352 can be positioned adjacent only one of the first and second sides 351, 353 (e.g., one of the first sides 351). In some embodiments, the first open region 352 can be positioned fully or partially along one or more of the first and second sides 351, 353. The second open region 354 can be positioned between the memory arrays 116 at least partially in a central region of the substrate 350. The substrate 350 can include a plurality of contacts 355 at/along the first open region 352 for receiving/transmitting signals between (e.g., from/to) the memory arrays 116 and an external device, such as the host device 120 of FIG. 1. In the illustrated embodiment, the memory arrays 116 each include an array region 356 and a stepped or staircase region 358.

Referring to FIG. 3B, in the illustrated embodiment the memory array 116 includes a plurality of tiers 360 arranged in a stack on the substrate 350. In the illustrated embodiment, the memory array 116 includes seven of the tiers 360 for ease of illustration. In practice, however, the memory array 116 can include many more tiers such as, for example, more than ten tiers, more than twenty tiers, more than fifty tiers, more than one hundred tiers, etc. In other embodiments, the memory array 116 can have fewer than seven tiers. Each of the tiers 360 can have a different lateral width (e.g., in a direction generally parallel to the substrate 350). More particularly, a lowermost one of the tiers 360 can have the greatest lateral width, and each successive one of the tiers 360 stacked on the lowermost one of the tiers 360 can have a smaller lateral width than the ones of the tiers 360 stacked below. Accordingly, the stack of the tiers 360 can define the staircase region 358 (e.g., a staircase portion) at which a portion (e.g., a peripheral region) of each one of the tiers 360 is exposed. In other embodiments, at least some of the tiers 360 can have the same lateral width.

In the illustrated embodiment, each of the tiers 360 includes a first layer 361 and a second layer 362 formed over the first layer 361. Thus, the memory array 116 includes a plurality of alternating (e.g., interleaved) first layers 361 and second layers 362. In some embodiments, each of the first and second layers 361, 362 is generally planar and has substantially the same thickness. In other embodiments, the first and second layers 361, 362 can have different and/or varying thicknesses (e.g., some or all of the first layers 361 can be thicker than the second layers 362, some or all of the second layers can 362 can be thicker than the first layers 361).

The first layers 361 are formed from (e.g., comprise, include) at least one electrically insulative material, such as oxide or nitride materials, silicon oxide, silicon nitride, and/or other electrically insulating materials. The second layers 362 each include a plurality of memory cells 340 electrically coupled to a conductive line 342 (e.g., a word line). The conductive lines 342 and the memory cells 340 can correspond (e.g., in terms of one or more functionalities) to one or more aspects of the row lines 242 and the memory cells 240, respectively, described in detail with reference to FIG. 2. The conductive lines 342 can be formed of an electrically conductive material, such as metal (e.g., tungsten), metal alloy, conductive-metal containing material, and/or the like.

In the illustrated embodiment, conductive pillars 344 (e.g., bit lines) extend through the tiers 360 in the array region 356 and are coupled to corresponding ones of the memory cells 340 in a vertical stack. That is, each of the pillars 344 is coupled to a corresponding stack of the memory cells 340. The pillars 344 can correspond (e.g., in terms of one or more functionalities) to one or more aspects of the column lines 244 described in detail with reference to FIG. 2, and can be formed of an electrically conductive material, such as metal (e.g., tungsten), metal alloy, conductive-metal containing material, and/or the like. Therefore, each of the memory cells 340 is electrically coupled to a corresponding one of the conductive lines 342 and a corresponding one of the pillars 344.

In some embodiments, the memory cells 340 (e.g., memory elements) can include/comprise a chalcogenide material or other alloy including selenium (Se), tellurium (Te), arsenic (As), antimony (Sb), carbon (C), germanium (Ge), silicon (Si), or indium (In), or various combinations thereof. In some embodiments, a chalcogenide material having primarily selenium (Se), arsenic (As), and germanium (Ge) may be referred to as a SAG-alloy. An SAG-alloy can also include silicon (Si) and such chalcogenide material can be referred to as SiSAG-alloy. An SAG-alloy can also include silicon (Si) and/or indium (In) and such chalcogenide materials can be referred to as SiSAGalloy or InSAG-alloy, respectively. In some embodiments, the chalcogenide material of the memory cells 340 can include additional elements such as hydrogen (H), oxygen (O), nitrogen (N), chlorine (Cl), or fluorine (F), each in atomic or molecular forms. The memory cells 340 can also be formed of other chalcogenide alloys not expressly recited herein.

In the illustrated embodiment, the memory array 116 further includes an electrically insulative material 365 formed over (i) the tiers 360 in the staircase region 358 and (ii) an upper surface of the second layer 362 of the (uppermost) one of the tiers 360 in the array region 356. The insulative material 365 can be a passivation, dielectric, or other suitable insulating material such as, for example, silicon oxide, tetraethyl orthosilicate (TEOS), and/or the like. The memory array 116 can further include a metallization structure 366 formed on and/or over at least a portion of the insulative material 365. A plurality of conductive members 367 can extend through the insulative material 365 to electrically couple the metallization structure 366 to the conductive lines 342. More specifically, the conductive members 367 can extend between and electrically connect the metallization structure 366 and the portion of the conductive lines 342 exposed at the staircase region 358. The metallization structure 366 can be, for example, a redistribution layer or other structure (e.g., including a plurality of conductive traces, vias, routings, and/or the like) that is configured to electrically couple the conductive lines 342 to, for example, the row decoder 241 of FIG. 2.

In the illustrated embodiment, the memory array 116 further includes a transistor (e.g., selector device) layer 368 extending below the tiers 360 over conductive access lines 369 over the substrate 350. The access lines 369 can be formed of copper, tungsten, alloys thereof, and/or other electrically conductive materials. The transistor layer 368 can comprise a plurality of transistors 370 (e.g., selectors; identified individually as first transistors 370a and second transistors 370b) surrounded by an insulative material 371 such as, for example, polysilicon. In some embodiments, the transistors 370 are thin-film transistors (TFTs) having a source, a drain, and a gate. In some embodiments, the transistors 370 are identical.

The first transistors 370a can be electrically coupled in parallel (e.g., via a conductive trace 373) between the access line 369 and a corresponding one of the conductive lines 342. For example, a first conductive member 374a can electrically couple the first transistors 370a to the metallization structure 366 and a second conductive member 374b can electrically couple the metallization structure 366 to the corresponding one of the conductive lines 342. In some embodiments, the first conductive member 374a can be insulated/electrically isolated from the tiers 360. In some embodiments, one of the source or drain of each of the first transistors 370a is electrically coupled to the conductive trace 373 and the other of the source or drain is electrically coupled to the access line 369. The gates of the first transistors 370a can be electrically coupled to a common source or separate sources for operating the first transistors 370a. In the illustrated embodiment, the first transistors 370a are electrically coupled to a fourth one of the conductive lines 342 from the bottom of the stack of the tiers 360. However, the memory array 116 can include many more of the various components extending, for example, into the page in FIG. 3B such that the first transistors 370a in different rows are coupled to different ones of the conductive lines 342 and different ones of the access lines 369. The first transistors 370a can correspond (e.g., in terms of one or more functionalities) to one or more aspects of the row decoder 241 described in detail with reference to FIG. 2.

The second transistors 370b can be electrically coupled between the access line 369 and a corresponding one of the pillars 344. In some embodiments, one of the source or drain of each of the second transistors 370b is electrically coupled to the corresponding one of the pillars 344 and the other of the source or drain is electrically coupled to the access line 369. The gates of the second transistors 370b can be electrically coupled to a common source or separate sources for operating the second transistors 370b. The second transistors 370b are configured to selectively activate the pillars 344. For example, based on a voltage applied to the access lines 369, the corresponding second transistors 370b may be selectively activated or deactivated. When activated (e.g., on, closed, conducting), the second transistors 370b may couple the corresponding pillars 344 with the access line 369, and thus the voltage of the pillars 344 may become equal or approximately equal to the voltage of the access line 369. A pillar decoder (e.g., the column decoder 243 of FIG. 2) can be configured to selectively activate (e.g., apply a selection voltage) or deactivate (e.g., apply a deselection voltage, or remove the selection voltage) one of the access lines 369 out of a set of the access lines 369 associated with the pillar decoder. The pillar decoder, the access lines 369, and the second transistors 370b can correspond (e.g., in terms of one or more functionalities) to one or more aspects of the column decoder 243 described in detail with reference to FIG. 2.

As described in detail above with reference to FIG. 2, various logic states can be stored by programming the electrical resistance of memory cells 340. In some embodiments, programming the electrical resistance includes passing a current through the memory cells 340, heating the memory cells 340, melting the material of the memory cells 340 (e.g., wholly or partially), and/or applying a voltage of a particular polarity to the memory cells 340. In some embodiments the memory cells 340 include one or more phase change materials (e.g., chalcogenide materials). In such embodiments, the memory cells 340 can exhibit an observable difference between resistances of a crystalline state and an amorphous state. For example, a phase change material in the crystalline state can have atoms arranged in a periodic structure, which can result in a relatively low electrical resistance. By contrast, a phase change material in an amorphous state can have no or relatively little periodic atomic structure, which can have a relatively high electrical resistance. Such a difference in resistance values between amorphous and crystalline states can be substantial. For example, a phase change material in an amorphous state can have a resistance one or more orders of magnitude greater than the resistance of the material in its crystalline state. In some embodiments, the phase change material can be partially amorphous and partially crystalline, and the resistance can be of some value between the resistances of the material in a wholly crystalline or wholly amorphous state. In such embodiments, a phase change material can be used to store more than two logic states (e.g., three or more logic states).

During a programming (write) operation of a phase change memory cell (e.g., the memory cells 340), the various parameters of the programming pulse can influence (e.g., determine, set, program) a particular behavior or characteristic of the material of the memory cells 340, such as the threshold voltage of the material or the resistance of the material. To program a low-resistance state (e.g., a relatively crystalline state) in a target one of the memory cells 340, a programming pulse can be applied that heats or melts the material of a storage element of the target memory cell 340, which can be associated with forming, at least temporarily, a relatively disordered (e.g., amorphous) atomic arrangement. The amplitude of the programming pulse can be reduced (e.g., relatively slowly) over a duration to allow the material to form crystalline structures as it cools, thereby forming a stable crystalline material state. To program a high-resistance state (e.g., a relatively amorphous state) in the target memory cell 340, a programming pulse can be applied that heats and/or melts the material of the storage element. The amplitude of the programming pulse can be reduced more quickly than the programming pulse for the low-resistance state. In such embodiments, the material can cool with atoms in a more disordered atomic arrangement because the atoms were not able to form crystalline structures before the material reached a stable state, thereby forming a stable amorphous material state. The difference in threshold voltages or resistances of the material of the storage element depending on the logic state stored by the material of the storage element can correspond to a read window of the storage element. Therefore, in some embodiments a portion of a storage element of the memory cells 340 undergoes a material change associated with the logic states.

In some embodiments, such as when the memory cells 340 are thresholding memory cells or self-selecting memory cells, some or all of a set of logic states supported by the memory cells 340 can be associated with a same state, such as an amorphous state of the chalcogenide material as opposed to a crystalline state of the chalcogenide material (e.g., the material can be operable to store different or multiple logic states while remaining in an amorphous state). In such embodiments, the material used in the memory cells 340 can be based on an alloy (such as the alloys listed above) and can be operated so as to undergo a state change during normal operation of the memory cells 340 (e.g., due to ion migration or segregation within the memory cells 340). For example, when the memory cells 340 are self-selecting, the memory cells 340 can have a high threshold voltage state and a low threshold voltage state. A high threshold voltage state can correspond to a first logic state (e.g., a reset state) and a low threshold voltage state can correspond to a second logic state (e.g., a set state). In some embodiments, the memory cells 340 can alternatively be switched between an amorphous and crystalline state during operation, with the amorphous and crystalline states corresponding to different resistances or threshold voltages and thus to different logic states, and such operation can be referred to, for example, as phase change operation.

In some embodiments, during a programming (e.g., write) operation of a self-selecting one of the memory cells 340, a polarity of one or more pulses used for a write operation can influence (e.g., determine, set, program) a particular behavior or characteristic of the material of the self-selecting memory cell 340, such as the threshold voltage of the material. The difference in threshold voltages of the material of the memory cell 340 depending on the logic state stored by the material of the self-selecting memory cell 340 (e.g., the difference between the threshold voltage when the material is storing a logic state '0' versus a logic state '1') can correspond to a read window of the self-selecting memory cell 340.

The memory cells 340 described herein can include, but not be limited to, phase change materials. Other types of memory cells 340 can include, for example, resistive memory or resistive RAM. In some cases, resistive RAM can use metal oxide materials whose electrical resistance is varied by controlling the ionic state of atoms in the material or by controlling the quantity or location of atomic vacancies (e.g., missing atoms) in the material.

As described herein, one or more access operations can be performed on a target one of the pillars 344 to access a target one of the memory cells 340 coupled with the target pillar 344. The target pillar 344 can be accessed or selected by applying voltages along a corresponding one of the access lines 369, and therefore to the one of the second transistors 370b coupled with the target pillar 344. When reading or programming the target memory cell 340 coupled with the target pillar 344, after selecting the target pillar 344, a target one of the conductive lines 342 coupled with the target memory cell 340 can be activated to access the target memory cell 340 (e.g., a first voltage can be applied to the target conductive line 342). Similarly, after selecting the target pillar 344, a second voltage (e.g., opposite in polarity to the first voltage) can be applied to the corresponding one of the access lines 369, and the selection voltage can be removed from the access line 369. Based on applying the voltages to the target conductive line 342 and the respective access line 369, a voltage difference can be applied across the target memory cell 340 (e.g., via the respective access line 369 and the target pillar 344, and via the target conductive line 342 coupled with the target memory cell 340).

In an example of performing positive programming or a positive read on the target memory cell 340, the second voltage can be applied to the respective access line 369, and the second voltage can be higher than the first voltage applied to the target conductive line 342 (e.g., the second voltage can have a positive polarity and the first voltage can have a negative polarity). In an example of performing negative programming or a negative read on the target memory cell 340, the second voltage can be applied to the respective access line 369, and the second voltage can be lower than the first voltage applied to the target conductive line 342 (e.g., the second voltage can have a negative polarity and the first voltage can have a positive polarity). In either positive or negative programming, a current can flow from the top to the bottom of the target pillar 344.

Referring again to FIG. 3A, in some embodiments the memory die 114 can include one or more fuse and/or antifuse arrays 318 ("fuse arrays 318"; e.g., including individually identified first through fourth fuse arrays 318a-318d, respectively) in/along some or all of the open regions of the substrate 350 that are not under (e.g., exposed) from the memory arrays 116, such as the first open region 352 and/or the second open region 354. In the illustrated embodiment, for example, the first through third open regions 318a-318c are positioned along/in the first open region 352 between the contacts 355, and the fourth fuse array 318d is positioned in the second open region 354 between the memory arrays 116. In other embodiments, one or more of the fuse arrays 318 can be positioned in a region under the memory arrays 116, under the contacts 355, or elsewhere along the substrate 350 where other functional components are absent. The fuse arrays 318 can correspond (e.g., in terms of one or more functionalities) to one or more aspects of the fuse array 118 described in detail with reference to FIG. 1 and can, for example, comprise a plurality of fuses and/or antifuses that are one-time-programmable to store information related to operating parameters (e.g., trim factors) of the memory device 110 and/or the memory dies 114.

Referring to FIGS. 3A and 3B together, the insulative material 371 of the transistor layer 368 can extend over the substrate 350 in the first and second open regions 352, 354, and additional ones of the transistors 370 can be manufactured in the transistor layer 368 and configured as the fuses and/or antifuses of the fuse arrays 318. That is, for example, the same manufacturing process used to form the transistors 370 for controlling access operations to the memory array 116 can be used to form additional ones of the transistors 370 for use in the fuse arrays 318.

Figure 4A:
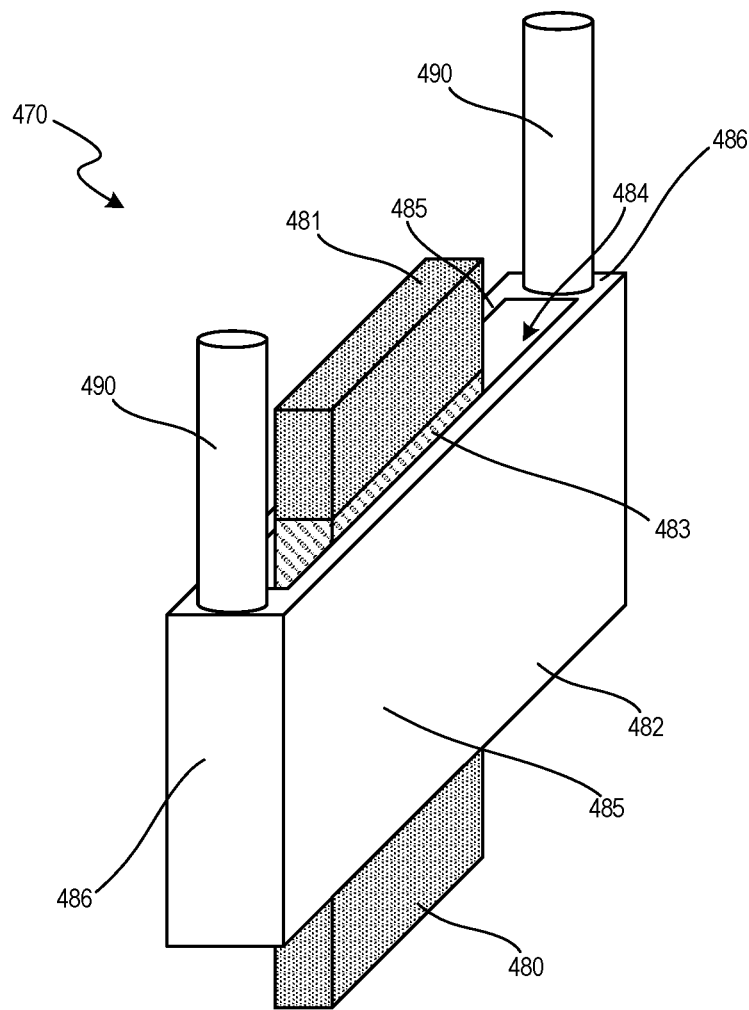
FIGS. 4A and 4B are isometric views of a transistor configured as a fuse before programming and after programming, respectively, in accordance with embodiments of the present technology.
Figure 4B:
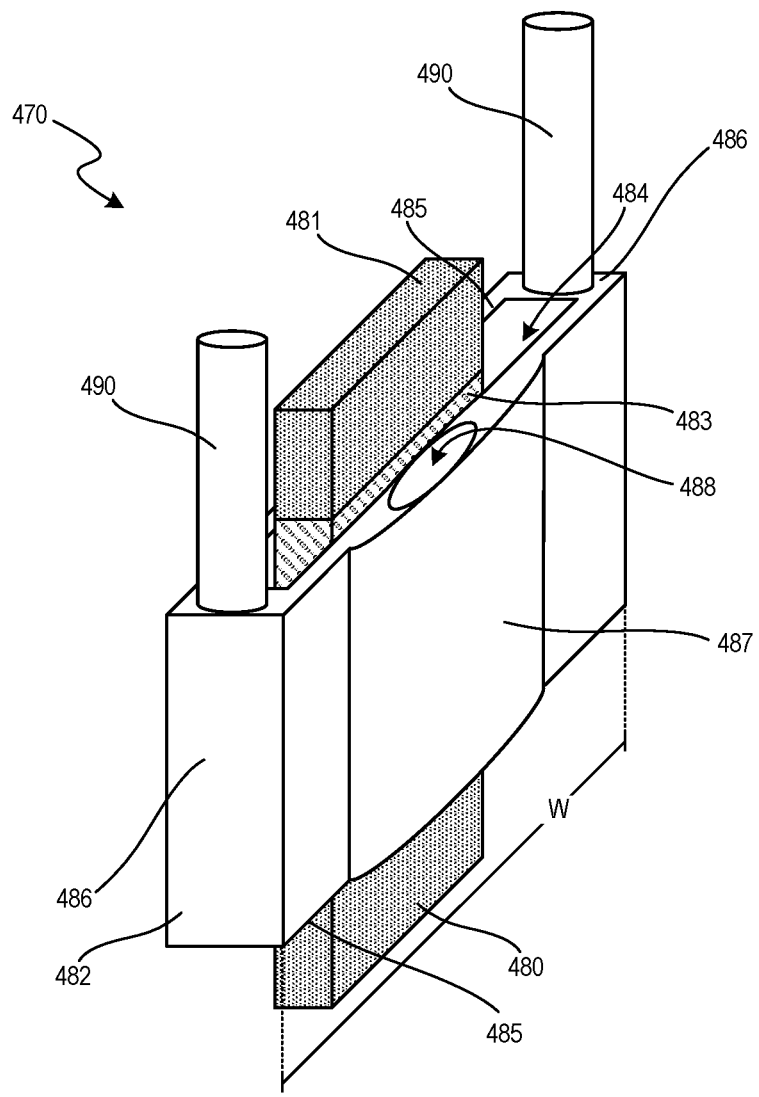

More specifically, FIGS. 4A and 4B are isometric views of one of the transistors 370 configured as a fuse 470 before programming and after programming, respectively, in accordance with embodiments of the present technology. Referring to FIGS. 4A and 4B together, in the illustrated embodiment the fuse 470 is a TFT having three terminals—a source 480, a drain 481, and a gate 482. The fuse 470 further includes a body 483 extending between (e.g., separating) the source 480 and the drain 481. In some embodiments, the fuse 470 is a field-effect transistor (FET). The gate 482 can comprise a conductive material, such as a titanium nitride or another conductive metal.

The source 480, the drain 481, and the body 483 can comprise a semiconductor structure (e.g., polysilicon) in which the source 480 and the drain 481 are differently doped than the body 483. For example, the source 480 and the drain 481 may be conductive and may comprise a heavily-doped, e.g., degenerate, semiconductor region. The body 483 can be a lightly-doped semiconductor region or channel. If the channel is n-type (i.e., majority carriers are electrons), then the fuse 470 can be referred to as a n-type FET. If the channel is p-type (i.e., majority carriers are holes), then the fuse 470 can be referred to as a p-type FET. The body 483 may be capped by an insulating gate oxide (not shown) that separates the body 483 from the gate 482. When the fuse 470 is configured as a transistor rather than a fuse (e.g., the first transistors 370a and the second transistors 370b described in detail above with reference to FIG. 3B), the channel conductivity may be controlled by applying a voltage to the gate 482. For example, applying a positive voltage or negative voltage to an n-type FET or a p-type FET, respectively, can result in the channel becoming conductive. The fuse 470 can be "on" or "activated" when a voltage greater than or equal to a threshold voltage of the fuse 470 is applied to the gate 482. The fuse 470 can be "off" or "deactivated" when a voltage less than the threshold voltage is applied to the gate 482.

In the illustrated embodiment, the gate 482 includes a channel 484 defined by a pair of side portions 485 and a pair of end portions 486, and in which the body 483 is positioned. To enable programming of the fuse 470, a pair of conductive contacts 490 (e.g., a supply contact and a return contact) can be formed to electrically contact the gate 482. In the illustrated embodiment, the 490 are formed on the opposing end portions 486 of the gate 482. With reference additional reference to FIG. 3B, the contacts 490 can extend at least partially through the insulative material 371 of the transistor layer 368 to electrically couple the gate 482 to other electronic elements in the insulative material 371 and/or in the substrate 350. For example, the contacts 490 can electrically couple the fuse 470 to a programming (e.g., write) circuit configured to program the fuse 470 and/or a read circuit configured to read out a state of the fuse 470. While two contacts 490 are shown in FIGS. 4A and 4B, in other embodiments more than two contacts can be provided on the gate 482 to, for example, increase reliability and robustness.

As shown in FIG. 4A, before programming the fuse 470, the gate 482 provides a conductive path between the contacts 490 having a relatively low resistance. To program the fuse 470, a relatively large current (e.g., a fuse programming current) can be supplied across the gate 482 via the contacts 490. Referring to FIG. 4B, such a current can at least partially break down (e.g., blow, fuse) the gate 482 by, for example, causing warpage or breakage 487 and/or one or more voids 488 in the side portions 485 or elsewhere along the gate 482. In some embodiments, the breakage 487 and/or voids 488 increase the resistance between the contacts 490 relative to the pre-programmed state shown in FIG. 4A. For example, the resistance between the contacts 490 can be one or more orders of magnitude (e.g., ten or more times) greater after programming. In some embodiments, after programming, the breakage 487 and/or voids 488 cause an open circuit between the contacts 490 (e.g., an infinite resistance). The current required to fuse the gate 482 can be selected by varying one or more dimensions of the gate 482. For example, decreasing a width W of the gate 482 can decrease the resistance of the gate 482 and thus the current required to fuse the gate 482. In some embodiments, the width W of the gate 482 is between about 500-1000 nanometers (e.g., about 800 nanometers).

Figure 5A:
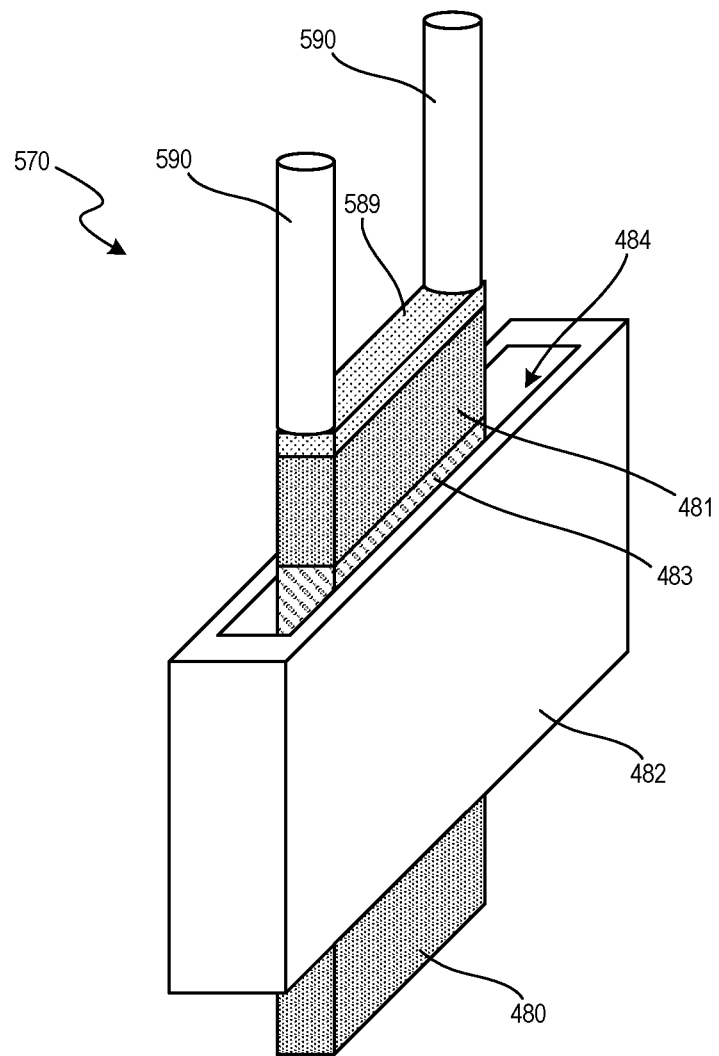
FIGS. 5A and 5B are isometric views of a transistor configured as a fuse before programming and after programming, respectively, in accordance with embodiments of the present technology.
Figure 5B:
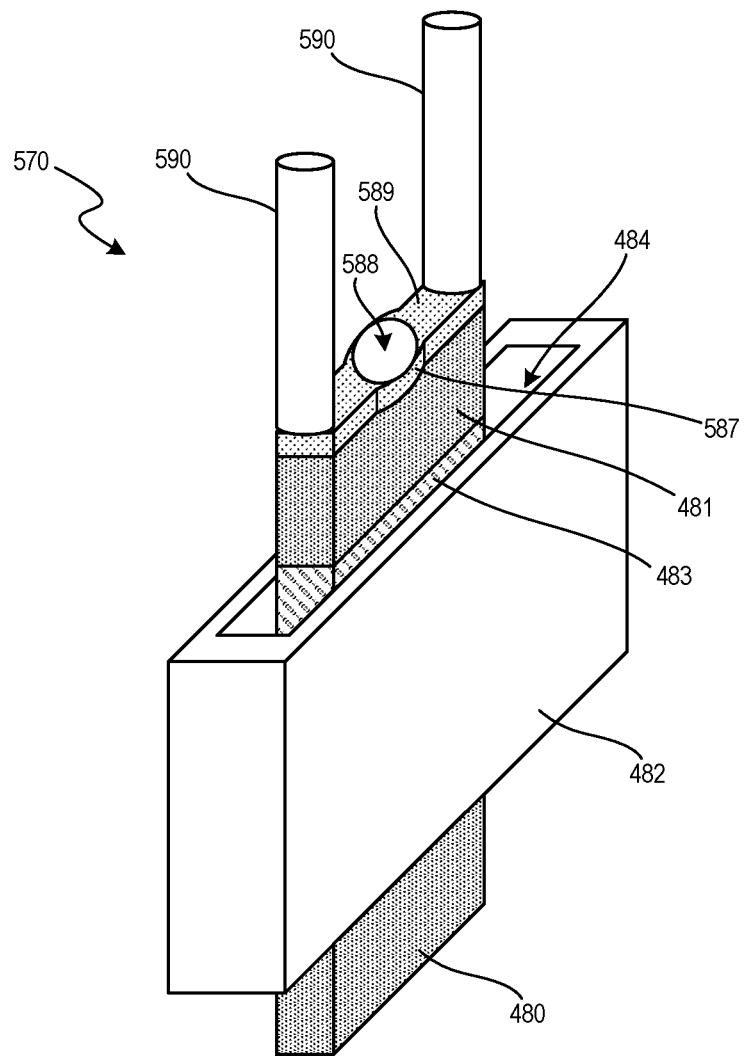

FIGS. 5A and 5B are isometric views of one of the transistors 370 configured as a fuse 570 before programming and after programming, respectively, in accordance with additional embodiments of the present technology. As shown in FIGS. 5A and 5B, the fuse 570 includes the same or similar components to the fuse 470 described in detail with reference to FIGS. 4A and 4B, but further includes a conductive layer 589 over the drain 481 and a pair of conductive contacts 590 electrically coupled to opposing end portions of the drain 481 along the width W (FIG. 4B) of the fuse 570. The conductive layer 589 can have a higher conductivity (e.g., lower resistance) than the drain 481. In some embodiments, the conductive layer 589 comprises silicide. In other embodiments, the conductive layer 589 and the contacts 590 can be formed over the source 480 rather than the drain 481. Moreover, while two contacts 490 are shown in FIGS. 4A and 4B, in other embodiments more than two contacts can be provided on the gate 482 to, for example, increase reliability and robustness.

As shown in FIG. 5A, before programming the fuse 570, the conductive layer 589 provides a conductive path between the contacts 590 having a relatively low resistance. To program the fuse 570, a relatively large current (e.g., a fuse programming current) can be supplied across the conductive layer 589 via the contacts 590. Referring to FIG. 5B, such a current can at least partially break down the conductive layer 589 by, for example, causing warpage or breakage 587 and/or one or more voids 588 therein. In some embodiments, after programming, the breakage 587 and/or voids 588 cause a current between the contacts 590 to pass entirely or partially through the relatively higher resistance material of the drain 481 such that the resistance is greater relative to the pre-programmed state shown in FIG. 5A. Accordingly, for example, after programming the fuse 570 can act as a polysilicon resistor rather than a silicide resistor. In some embodiments, the resistance between the contacts 590 can be one or more orders of magnitude (e.g., ten or more times) greater after programming. The current required to fuse the conductive layer 589 can be selected by varying one or more dimensions of the conductive layer 589. For example, decreasing a width, length, and/or thickness of the conductive layer 589 can decrease the resistance of the conductive layer 589 and thus the current required to fuse the conductive layer 589. In some embodiments, the programming current can between about 50-150 microamperes (e.g., about 100 microamperes).

Referring to FIGS. 3A-5B together, in some aspects of the present technology, electrical contacts or other connections other than the contacts 487/587 need not be provided to the fuses 470/570 because they are not intended to be operated as transistors. For example, electrical contacts need not be connected to the source 480 or the drain 481 in the fuse 470 shown in FIGS. 4A and 4B, and electrical contacts need not be connected to the source 480 or the gate 482 in the fuse 570 shown in FIGS. 5A and 5B. In fact, the fuses 470/570 can be formed in the insulative material 371 of the transistor layer 368 such that these terminals of the fuses 470/570 are surrounded by the insulative material 371 and electrically insulated. Further, the fuses 470/570 are one-time programmable (OTP) because, after programming, the physical structure of the fuses 470/570 is permanently changed (e.g., by breaking down the gate 482 and/or the conductive layer 589).

Figure 6:
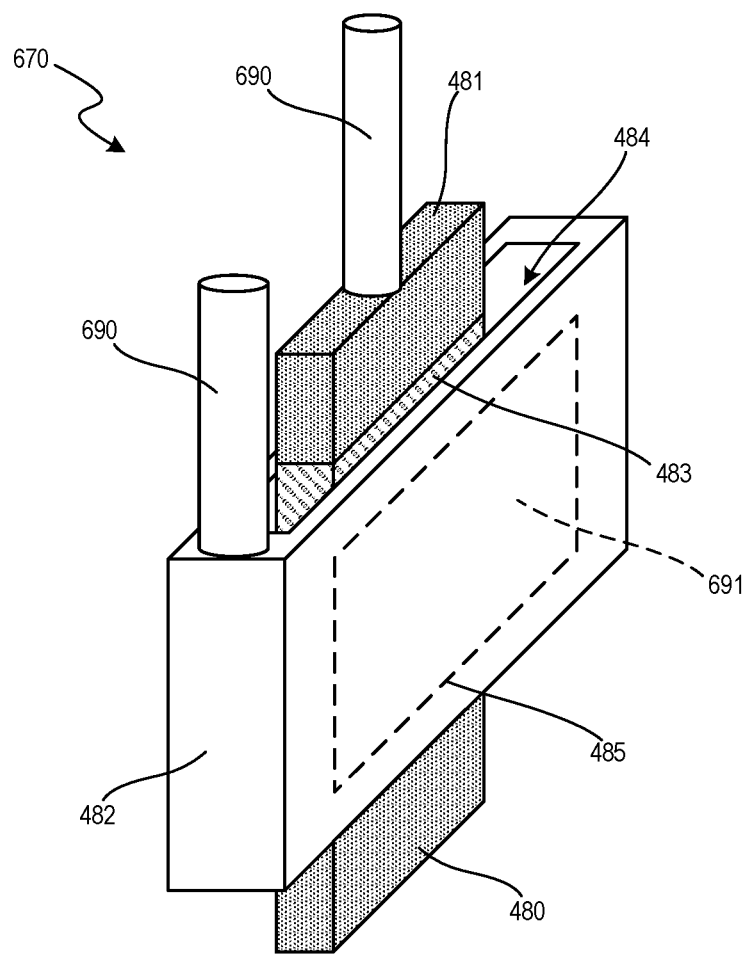
FIG. 6 is an isometric view of a transistor configured as an antifuse in accordance with embodiments of the present technology.

FIG. 6 is an isometric view of one of the transistors 370 configured as an antifuse 670 in accordance with embodiments of the present technology. In the illustrate embodiment, the antifuse 670 includes the same or similar components to the fuses 470/570 described in detail with reference to FIGS. 4A-5B, but further includes an oxide 691 (e.g., a gate oxide; shown schematically) at least partially between (i) the gate 482 and (ii) the source 480, the drain 481, and/or the body 483. In the illustrated embodiment, one or more conductive contacts 690 can be provided on (i) the gate 482 and (ii) the drain 481 and/or the source 480. While a single one of the contacts 690 is shown on the drain 481 in FIG. 6, one or more of the contacts 690 could be alternatively or additionally be provided on the source 480. To program the antifuse 670 as an antifuse, a relatively large current (e.g., a programming current) can be supplied between the contacts 690 to break down the oxide 691 and form a conductive channel therein. In some embodiments, after programming, the conductive channel provides a low resistance path between the gate 482 and the drain 481 and/or source 480 that is lower than the resistance in the pre-programmed state before the oxide 691 is broken down. The antifuse 670 is one-time programmable (OTP) because, after programming, the physical structure of the antifuse 670 is permanently changed by breaking down the oxide 691 to form the conductive channel between the gate 482 and the drain 481 and/or the source 480.

Figure 7:
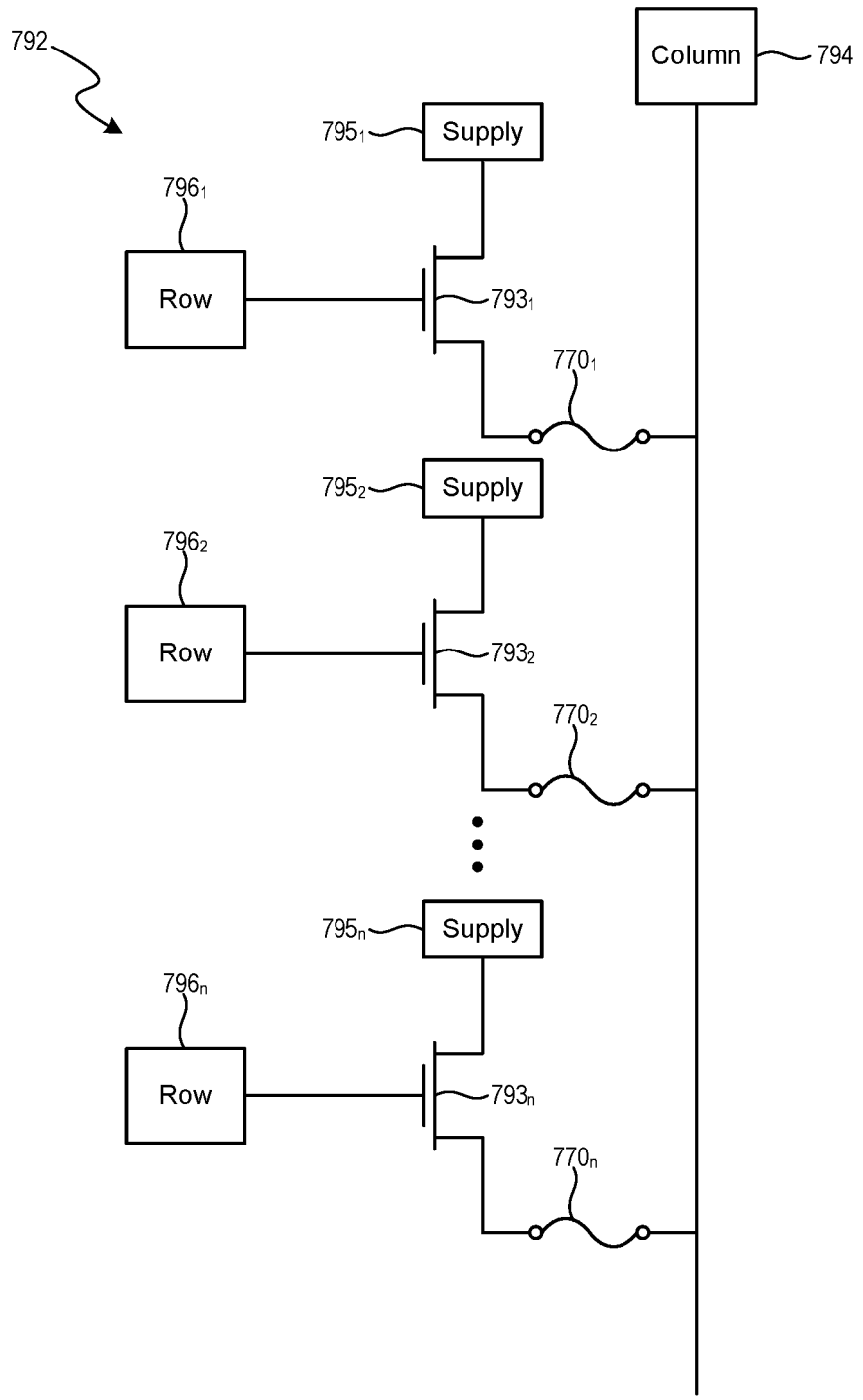
FIG. 7 is a schematic view of a read and/or write circuit for a fuse and/or antifuse array in accordance with embodiments of the present technology.

FIG. 7 is a schematic view of a read and/or write circuit 792 for a fuse and/or antifuse array in accordance with embodiments of the present technology. In the illustrated embodiment, a plurality of fuses and/or antifuses 770 (collectively "fuses 770"; identified individually as fuses $770_1$-$770_n$) are formed in an array. The fuses 770 can, for example, comprises multiple ones of the fuses 470/570 and/or the antifuses 670 described in detail above with reference to FIGS. 4-6. Each of the fuses 770 can be electrically coupled between a first conductive line 794 (e.g., a column line) and a transistor 793 (e.g., a first terminal thereof; identified individually as transistors $793_1$-$793_n$). Each of the transistors 793 (e.g., a second terminal thereof) can be further electrically coupled to a corresponding electrical supply 795 (identified individually as supplies $795_1$-$795_n$) and each of the transistors 793 (e.g., a third terminal thereof) can be further electrically coupled to a corresponding second conductive line 796 (identified individually as second conductive lines $796_1$-$796_n$).

To program (e.g., write) the fuses 770 (e.g., to have a high resistance corresponding to a first logic state and a low resistance corresponding to a second logic state), the voltages on the first conductive line 794 and the supplies 795 can be varied. For example, a relatively large voltage difference can be formed across select ones of the fuses 770 to break down a material thereof to transition the fuses 770 to a high resistance state (e.g., in the instances of the fuses 470/570) or to break down a material thereof to transition the antifuses 770 to a low resistance state (e.g., in the instance of the antifuses 670). In this manner, as described in detail above with reference to FIG. 1, the array of fuses 770 can be programmed as a non-volatile memory (NVM) array to store, for example, trim factors (e.g., trim codes). That is, for example, a first subset of the fuses 770 can be programmed to have a high resistance representing a first logic state by applying a programming current thereacross to break down (e.g., blow) or substantially break down a material of the fuses 770, while a second subset of the fuses 770 can be programmed to have a low resistance representing a second logic state by selectively not applying the programming current thereacross to leave the materials of the fuses 770 intact. The fuses 770 to which the programming current is not applied can be identical in structure to the transistors 370 described in detail with reference to FIG. 3B. Similarly, for example, a first subset of the antifuses 770 can be programmed to have a low resistance representing a first logic state by applying a programming current thereacross to break down or substantially break down a gate oxide of the antifuses 770, while a second subset of the antifuses 770 can be programmed to have a high resistance representing a second logic state by selectively not applying the programming current thereacross to leave the gate oxide of the antifuses 770 intact. The antifuses 770 to which the programming current is not applied can be identical in structure to the transistors 370 described in detail with reference to FIG. 3B. To read the information stored in the fuses 770 during operation, the voltages on the first conductive line 794 and the second conductive lines 796 can be varied to determine the resistances of the fuses 770 and, therefore, the associated logic states.

Referring to FIGS. 3A, 3B, and 7 together, the fuses 770 are formed in the transistor layer 768 along/in open regions of the substrate 350 that do not contain other functional elements. Additionally, the fuses 770 can be formed using the same process and manufacturing steps as the transistors 370 and are identical to the transistors 370 before programming. Accordingly, some aspects of the present technology provide for the efficient formation of a fuse array without increasing the size of the memory die 114 and without adding additional process and manufacturing steps.

In some embodiments, the transistors 793 can be formed in the substrate 350. In other embodiments, the transistors 793 can each comprise multiple ones of the transistors 370 connected in parallel to supply a sufficiently high voltage level. Such transistors can similarly be formed in open regions of the substrate 350 without additional process and manufacturing steps. Accordingly, in some such embodiments, all or substantially all of the circuit 792 can be formed in the transistor layer 768—further increasing the efficiency of the memory die 114.

The following examples are illustrative of several embodiments of the present technology:

1. A memory device, comprising:
a substrate;
an insulative layer over the substrate;
a memory array over the insulative layer; and a plurality of transistors positioned in the insulative layer, wherein the transistors each include a source, a drain, and a gate, and wherein the transistors are configured as fuses such that (a) the transistors in a first subset of the transistors have a first resistance across the gate and (b) the transistors in a second subset of the transistors have a second resistance across the gate that is greater than the first resistance.

2. The memory device of example 1 wherein the transistors are thin-film transistors (TFTs).

3. The memory device of example 1 or example 2, further comprising a plurality of conductive contacts, wherein at least two of the conductive contacts are electrically coupled to a corresponding gate of each of the transistors and configured to receive a current sufficient to break down a material of the gate to increase the resistance of the gate from the first resistance to the second resistance.

4. The memory device of example 3 wherein the material of the gate is titanium nitride.

5. The memory device of any one of examples 1-4 wherein the substrate and the insulative layer are exposed from the memory array at an open portion, and wherein the plurality of transistors are formed in the insulative layer at the open portion.

6. The memory device of example 5 wherein the open portion is positioned at a periphery of the substrate.

7. The memory device of any one of examples 1-6 wherein the memory array is a first memory array, and further comprising a second memory array over the insulative layer, wherein the plurality of transistors are formed in the insulative layer between the first memory array and the second memory array.

8. The memory device of any one of examples 1-7 wherein the source and the drain of each of the transistors are surrounded by an electrically insulative material.

9. The memory device of any one of examples 1-8 wherein the second resistance is at least ten times greater than the first resistance.

10. The memory device of any one of examples 1-9 wherein the transistors are first transistors, and further comprising a plurality of second transistors positioned in the insulative layer under the memory array, wherein the second transistors are electrically coupled to the memory array, and wherein the first transistors in the first subset are identical to the second transistors.

11. The memory device of example 9 wherein the memory array is a three-dimensional (3D) memory array including a plurality of memory cells arranged in stacks and a plurality of conductive pillars electrically coupled to corresponding ones of the stacks of memory cells, and wherein individual ones of the second transistors are electrically coupled to corresponding ones of the conductive pillars.

12. The memory device of any one of examples 1-11 wherein the first resistance corresponds to a first logic state, wherein the second resistance corresponds to a second logic state, and wherein the first logic states and the second logic states are configured to represent a trim factor for the memory array.

13. A memory device, comprising:
a substrate;
an insulative layer formed over the substrate;
a memory array over the insulative layer; and
a plurality of transistors positioned in the insulative layer, wherein the transistors each include a source, a drain, a gate, and a conductive layer over one of the source and the drain, and wherein the transistors are configured as fuses such that (a) the transistors in a first subset of the transistors have a first resistance across the conductive layer and (b) the transistors in a second subset of the transistors have a second resistance across the conductive layer that is greater than the first resistance.

14. The memory device of example 13 wherein the transistors are thin-film transistors (TFTs), and wherein the second resistance is at least ten times greater than the first resistance.

15. The memory device of example 13 or example 14 wherein the conductive layer comprises silicide.

16. The memory device of any one of examples 13-15, further comprising a plurality of conductive contacts, wherein at least two of the conductive contacts are electrically coupled to a corresponding conductive layer of each of the transistors and configured to receive a current sufficient to break down a material of the conductive layer to increase the resistance across the conductive layer from the first resistance to the second resistance.

17. The memory device of any one of examples 13-16 wherein the transistors are first transistors, wherein the memory array is a three-dimensional (3D) memory array including a plurality of memory cells arranged in stacks and a plurality of conductive pillars electrically coupled to corresponding ones of the stacks of memory cells, and further comprising a plurality of second transistors positioned in the insulative layer under the memory array, wherein individual ones of the second transistors are electrically coupled to corresponding ones of the conductive pillars, and wherein the first transistors in the first subset are identical to the second transistors.

18. The memory device of any one of examples 13-17 wherein the first resistance corresponds to a first logic state, wherein the second resistance corresponds to a second logic state, and wherein the first logic states and the second logic states are configured to represent a trim factor for the memory array.

19. A memory device, comprising:
a substrate;
an insulative layer over the substrate;
a memory array over the insulative layer; and
a plurality of transistors positioned in the insulative layer, wherein the transistors each include a source, a drain, and a gate, wherein the transistors are configured as fuses, wherein individual ones of the fuses store a first logic state or a second logic state, wherein the first logic states and the second logic states of the fuses together represent a trim factor for the memory array, and wherein—
  a first subset of the fuses have received a current sufficient to break down one of the source, the drain, and the gate such that the fuses in the first subset have a first resistance across the one of the source, the drain, and the gate that represents the first logic state, and
  a second subset of the fuses have a second resistance across the one of the source, the drain, and the gate that is lower than the first resistance and represents the second logic state.

20. The memory device of example 19 wherein the transistors are first transistors, wherein the memory array is a three-dimensional (3D) memory array including a plurality of memory cells arranged in stacks and a plurality of conductive pillars electrically coupled to corresponding ones of the stacks of memory cells, and further comprising a plurality of second transistors positioned in the insulative layer under the memory array, wherein individual ones of the second transistors are electrically coupled to corresponding ones of the conductive pillars, and wherein the fuses in the second subset are identical to the second transistors.

21. The memory device of example 19 or example 20 wherein the transistors are thin-film transistors (TFTs), and wherein the second resistance is at least ten times greater than the first resistance.

22. A method of manufacturing a memory device, the method comprising:
  forming a plurality of transistors in an insulative layer over a substrate, wherein the transistors each include a source, a drain, and a gate;
  forming a memory array over the insulative layer;
  electrically coupling one of the source, the drain, and the gate of each of the transistors to two or more conductive contacts; and
  configuring the transistors as fuses, wherein the configuring includes selectively supplying a current to the conductive contacts sufficient to break down a material of the one of the source, the drain, and the gate of a first subset of the transistors, wherein the transistors in the first subset have a first resistance, and wherein the transistors in a second subset of the transistors have a second resistance different from the first resistance.

23. The method of example 22 wherein the transistors are thin-film transistors (TFTs), and wherein the second resistance is at least ten times greater than the first resistance.

24. The method of example 22 or example 23 wherein the configuring includes not supplying the current sufficient to break down the material to the conductive contacts of the second subset of the transistors.

25. The method of any one of examples 22-24 wherein—
  the transistors are first transistors,
  forming the memory array includes forming a three-dimensional (3D) memory array including a plurality of memory cells arranged in stacks and a plurality of conductive pillars electrically coupled to corresponding ones of the stacks of memory cells,
  the method further comprises forming a plurality of second transistors in the insulative layer under the 3D memory array and to be electrically coupled to corresponding ones of the conductive pillars, and
  the first transistors in the second subset are identical to the second transistors.

Aspects of the present technology can be modified, if necessary, to employ the systems, functions, and concepts of the various references described above to provide yet further implementations of the present technology. The teachings of the present technology provided herein can be applied to other systems, not necessarily the system described above. The elements and features of the various examples described above can be combined to provide further implementations of the present technology. Some alternative implementations of the present technology may include not only additional elements to those implementations noted above, but also may include fewer elements. Further any specific numbers noted herein are only examples: alternative implementations may employ differing values or ranges.

As used herein, the use of relative terminology, such as "about", "generally", "approximately", "substantially" and the like refer to the stated value plus or minus ten percent. For example, the use of the term "about 100" refers to a range of from 90 to 110, inclusive. In instances in which the context requires otherwise and/or relative terminology is used in reference to something that does not include, or is not related to, a numerical value, the terms are given their ordinary meaning to one skilled in the art. As used herein, the term "and/or" when used in the phrase "A and/or B" means "A, or B, or both A and B." A similar manner of interpretation applies to the term "and/or" when used in a list of more than two terms.

References throughout the foregoing description to features, advantages, or similar language do not imply that all of the features and advantages that may be realized with the present technology should be or are in any single embodiment of the present technology. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference in the entirety, except for any subject matter disclaimers or disavowals, and except to the extent that the incorporated material is inconsistent with the express disclosure herein, in which case the language in this disclosure controls. Aspects of the present technology can be modified, if necessary, to employ the systems, functions, and concepts of the various references described above to provide yet further implementations of the present technology.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples and embodiments of the present technology is not intended to be exhaustive or to limit the present technology to the precise form disclosed above. While specific examples for the present technology are described above for illustrative purposes, various equivalent modifications are possible within the scope of the present technology, as those skilled in the relevant art will recognize.

While the above description describes various embodiments of the present technology and the best mode contemplated, regardless how detailed the above text, the present technology can be practiced in many ways. Details of the system may vary considerably in its specific implementation, while still being encompassed by the present disclosure. As noted above, particular terminology used when describing certain features or aspects of the present technology should not be taken to imply that the terminology is being redefined herein to be restricted to any specific characteristics, features, or aspects of the present technology with which that terminology is associated. In general, the terms used in the following claims should not be construed to limit the present technology to the specific examples disclosed in the specification, unless the above Detailed Description section explicitly defines such terms. Accordingly, the actual scope of the present technology encompasses not only the disclosed examples, but also all equivalent ways of practicing or implementing the present technology under the claims.

From the foregoing, it will be appreciated that specific embodiments of the present technology have been described herein for purposes of illustration, but that various modifications may be made without deviating from the spirit and scope of the various embodiments of the present technology. Further, while various advantages associated with certain embodiments of the present technology have been described above in the context of those embodiments, other embodiments may also exhibit such advantages, and not all embodiments need necessarily exhibit such advantages to fall within the scope of the present technology. Accordingly, the invention is not limited, except as by the appended claims.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing or other related application.

We claim:

1. A memory device, comprising:
   a substrate;
   an insulative layer over the substrate;
   a memory array over the insulative layer; and
   a plurality of transistors positioned in the insulative layer, wherein the transistors each include a source, a drain, and a gate, and wherein the transistors are configured as fuses such that (a) the transistors in a first subset of the transistors have a first resistance across the gate and (b) the transistors in a second subset of the transistors have a second resistance across the gate that is greater than the first resistance.

2. The memory device of claim 1 wherein the transistors are thin-film transistors (TFTs).

3. The memory device of claim 1, further comprising a plurality of conductive contacts, wherein at least two of the conductive contacts are electrically coupled to a corresponding gate of each of the transistors and configured to receive a current sufficient to break down a material of the gate to increase the resistance of the gate from the first resistance to the second resistance.

4. The memory device of claim 3 wherein the material of the gate is titanium nitride.

5. The memory device of claim 1 wherein the substrate and the insulative layer are exposed from the memory array at an open portion, and wherein the plurality of transistors are formed in the insulative layer at the open portion.

6. The memory device of claim 5 wherein the open portion is positioned at a periphery of the substrate.

7. The memory device of claim 1 wherein the memory array is a first memory array, and further comprising a second memory array over the insulative layer, wherein the plurality of transistors are formed in the insulative layer between the first memory array and the second memory array.

8. The memory device of claim 1 wherein the source and the drain of each of the transistors are surrounded by an electrically insulative material.

9. The memory device of claim 1 wherein the second resistance is at least ten times greater than the first resistance.

10. The memory device of claim 1 wherein the transistors are first transistors, and further comprising a plurality of second transistors positioned in the insulative layer under the memory array, wherein the second transistors are electrically coupled to the memory array, and wherein the first transistors in the first subset are identical to the second transistors.

11. The memory device of claim 9 wherein the memory array is a three-dimensional (3D) memory array including a plurality of memory cells arranged in stacks and a plurality of conductive pillars electrically coupled to corresponding ones of the stacks of memory cells, and wherein individual ones of the second transistors are electrically coupled to corresponding ones of the conductive pillars.

12. The memory device of claim 1 wherein the first resistance corresponds to a first logic state, wherein the second resistance corresponds to a second logic state, and wherein the first logic states and the second logic states are configured to represent a trim factor for the memory array.

13. A memory device, comprising:
    a substrate;
    an insulative layer formed over the substrate;
    a memory array over the insulative layer; and
    a plurality of transistors positioned in the insulative layer, wherein the transistors each include a source, a drain, a gate, and a conductive layer over one of the source and the drain, and wherein the transistors are configured as fuses such that (a) the transistors in a first subset of the transistors have a first resistance across the conductive layer and (b) the transistors in a second subset of the transistors have a second resistance across the conductive layer that is greater than the first resistance.

14. The memory device of claim 13 wherein the transistors are thin-film transistors (TFTs), and wherein the second resistance is at least ten times greater than the first resistance.

15. The memory device of claim 13 wherein the conductive layer comprises silicide.

16. The memory device of claim 13, further comprising a plurality of conductive contacts, wherein at least two of the conductive contacts are electrically coupled to a corresponding conductive layer of each of the transistors and configured to receive a current sufficient to break down a material of the conductive layer to increase the resistance across the conductive layer from the first resistance to the second resistance.

17. The memory device of claim 13 wherein the transistors are first transistors, wherein the memory array is a three-dimensional (3D) memory array including a plurality of memory cells arranged in stacks and a plurality of conductive pillars electrically coupled to corresponding ones of the stacks of memory cells, and further comprising a plurality of second transistors positioned in the insulative layer under the memory array, wherein individual ones of the second transistors are electrically coupled to corresponding ones of the conductive pillars, and wherein the first transistors in the first subset are identical to the second transistors.

18. The memory device of claim 13 wherein the first resistance corresponds to a first logic state, wherein the second resistance corresponds to a second logic state, and wherein the first logic states and the second logic states are configured to represent a trim factor for the memory array.

19. A memory device, comprising:
 a substrate;
 an insulative layer over the substrate;
 a memory array over the insulative layer; and
 a plurality of transistors positioned in the insulative layer, wherein the transistors each include a source, a drain, and a gate, wherein the transistors are configured as fuses, wherein individual ones of the fuses store a first logic state or a second logic state, wherein the first logic states and the second logic states of the fuses together represent a trim factor for the memory array, and wherein—
  a first subset of the fuses have received a current sufficient to break down one of the source, the drain, and the gate such that the fuses in the first subset have a first resistance across the one of the source, the drain, and the gate that represents the first logic state, and
  a second subset of the fuses have a second resistance across the one of the source, the drain, and the gate that is lower than the first resistance and represents the second logic state.

20. The memory device of claim 19 wherein the transistors are first transistors, wherein the memory array is a three-dimensional (3D) memory array including a plurality of memory cells arranged in stacks and a plurality of conductive pillars electrically coupled to corresponding ones of the stacks of memory cells, and further comprising a plurality of second transistors positioned in the insulative layer under the memory array, wherein individual ones of the second transistors are electrically coupled to corresponding ones of the conductive pillars, and wherein the fuses in the second subset are identical to the second transistors.

21. The memory device of claim 20 wherein the transistors are thin-film transistors (TFTs), and wherein the second resistance is at least ten times greater than the first resistance.

22. A method of manufacturing a memory device, the method comprising:
 forming a plurality of transistors in an insulative layer over a substrate, wherein the transistors each include a source, a drain, and a gate;
 forming a memory array over the insulative layer;
 electrically coupling one of the source, the drain, and the gate of each of the transistors to two or more conductive contacts; and
 configuring the transistors as fuses, wherein the configuring includes selectively supplying a current to the conductive contacts sufficient to break down a material of the one of the source, the drain, and the gate of a first subset of the transistors, wherein the transistors in the first subset have a first resistance, and wherein the transistors in a second subset of the transistors have a second resistance different from the first resistance.

23. The method of claim 22 wherein the transistors are thin-film transistors (TFTs), and wherein the second resistance is at least ten times greater than the first resistance.

24. The method of claim 22 wherein the configuring includes not supplying the current sufficient to break down the material to the conductive contacts of the second subset of the transistors.

25. The method of claim 22 wherein—
 the transistors are first transistors,
 forming the memory array includes forming a three-dimensional (3D) memory array including a plurality of memory cells arranged in stacks and a plurality of conductive pillars electrically coupled to corresponding ones of the stacks of memory cells,
 the method further comprises forming a plurality of second transistors in the insulative layer under the 3D memory array and to be electrically coupled to corresponding ones of the conductive pillars, and
 the first transistors in the second subset are identical to the second transistors.

* * * * *